(12) United States Patent
Dau et al.

(10) Patent No.: US 10,096,958 B2
(45) Date of Patent: Oct. 9, 2018

(54) INTERFACE APPARATUS FOR SEMICONDUCTOR TESTING AND METHOD OF MANUFACTURING SAME

(71) Applicants: Hai Dau, San Ramon, CA (US); Lim Hooi Weng, Singapore (SG); Kothandan Shanmugam, Singapore (SG); Christine Bui, Gilroy, CA (US)

(72) Inventors: Hai Dau, San Ramon, CA (US); Lim Hooi Weng, Singapore (SG); Kothandan Shanmugam, Singapore (SG); Christine Bui, Gilroy, CA (US)

(73) Assignee: Spire Manufacturing Inc., Fremont, CA (US)

( * ) Notice: Subject to any disclaimer, the term of this patent is extended or adjusted under 35 U.S.C. 154(b) by 0 days.

(21) Appl. No.: 14/864,823

(22) Filed: Sep. 24, 2015

(65) Prior Publication Data

US 2017/0093101 A1   Mar. 30, 2017

(51) Int. Cl.
| H01R 27/02 | (2006.01) |
| H01R 43/02 | (2006.01) |
| H01R 43/20 | (2006.01) |
| G01R 1/073 | (2006.01) |
| H01R 12/73 | (2011.01) |

(52) U.S. Cl.
CPC ............ *H01R 27/02* (2013.01); *G01R 1/073* (2013.01); *H01R 12/73* (2013.01); *H01R 43/0235* (2013.01); *H01R 43/20* (2013.01)

(58) Field of Classification Search
CPC .... H01R 27/02; H01R 43/0235; H01R 43/20; H01R 12/73

USPC ......................................................... 439/638
See application file for complete search history.

(56) References Cited

U.S. PATENT DOCUMENTS

| 4,420,868 A * | 12/1983 | McEwen ................. B23P 15/22 29/460 |
| 4,505,035 A * | 3/1985 | Burton ................. H01R 43/205 228/180.21 |
| 5,031,308 A * | 7/1991 | Yamashita ............. H05K 3/462 174/259 |
| 5,672,062 A * | 9/1997 | Lindeman .......... H01R 13/2407 439/66 |
| 6,159,586 A * | 12/2000 | Inoue .................. H01L 21/4857 174/258 |
| 6,332,782 B1 * | 12/2001 | Bezama ................. H05K 1/141 439/66 |

(Continued)

*Primary Examiner* — Aexander Gilman
(74) *Attorney, Agent, or Firm* — Mark Gonzales

(57) ABSTRACT

In one embodiment, the present invention includes an interface apparatus for semiconductor testing. The interface apparatus includes a housing. The housing includes a lower housing substrate and an upper housing substrate. The lower housing substrate has a plurality of apertures arranged according to a fine pitch, and the upper housing substrate has a plurality of apertures arranged according to a coarse pitch. A plurality of wires passes through the plurality of apertures from the lower housing substrate to the upper housing substrate. Each wire has plated conductive ends emanating from opposing sides of the housing. The plurality of apertures of the lower housing substrate corresponds to the plurality of apertures of the upper housing substrate. The interface apparatus transforms a pattern having a course pitch to a pattern having a fine pitch.

7 Claims, 6 Drawing Sheets

(56) References Cited

U.S. PATENT DOCUMENTS

| | | | | |
|---|---|---|---|---|
| 6,520,778 B1* | 2/2003 | Eldridge | H01L 24/11 | 257/E23.021 |
| 6,675,469 B1* | 1/2004 | Haba | H01L 21/486 | 257/E21.585 |
| 6,736,665 B2* | 5/2004 | Zhou | G01R 1/06711 | 257/E23.021 |
| 6,876,216 B2* | 4/2005 | Fu-Chin | G01R 1/07378 | 324/754.07 |
| 6,917,102 B2* | 7/2005 | Zhou | G01R 1/07378 | 257/690 |
| 6,981,881 B2* | 1/2006 | Adachi | G01R 1/0483 | 439/71 |
| 7,227,371 B2* | 6/2007 | Miller | G01R 1/07314 | 324/754.14 |
| 7,276,790 B2* | 10/2007 | Seng | H01L 25/0657 | 257/724 |
| 7,378,596 B2* | 5/2008 | Kawaguchi | H05K 3/4691 | 174/255 |
| 7,396,236 B2* | 7/2008 | Eldridge | G01R 1/07307 | 324/750.05 |
| 7,492,039 B2* | 2/2009 | Seng | H01L 23/3128 | 257/686 |
| 7,566,960 B1* | 7/2009 | Conn | H01L 23/055 | 257/678 |
| 8,134,380 B2* | 3/2012 | Kuo | G01R 31/2822 | 324/754.07 |
| 8,148,646 B2* | 4/2012 | Fan | G01R 3/00 | 174/261 |
| 8,292,666 B2* | 10/2012 | Cheng | H01R 12/714 | 439/626 |
| 8,378,217 B2* | 2/2013 | Sugiyama | H01B 11/203 | 174/113 R |
| 8,404,520 B1* | 3/2013 | Chau | H01L 23/49517 | 228/155 |
| 8,475,179 B2* | 7/2013 | Lin | H01R 12/7082 | 439/66 |
| 8,653,384 B2* | 2/2014 | Tang | A61N 1/3754 | 174/152 GM |
| 8,664,538 B2* | 3/2014 | Kim | H01L 21/6835 | 174/260 |
| 8,780,576 B2* | 7/2014 | Haba | H01L 23/49827 | 174/254 |
| 8,878,560 B2* | 11/2014 | Kuo | G01R 1/06772 | 29/593 |
| 8,933,717 B2* | 1/2015 | Audette | G01R 1/06744 | 324/755.01 |
| 8,940,630 B2* | 1/2015 | Damberg | H01L 23/4952 | 257/E21.499 |
| 9,136,254 B2* | 9/2015 | Zhao | H01L 24/43 | |
| 2011/0127664 A1* | 6/2011 | Antesberger | H01L 23/49833 | 257/692 |

\* cited by examiner

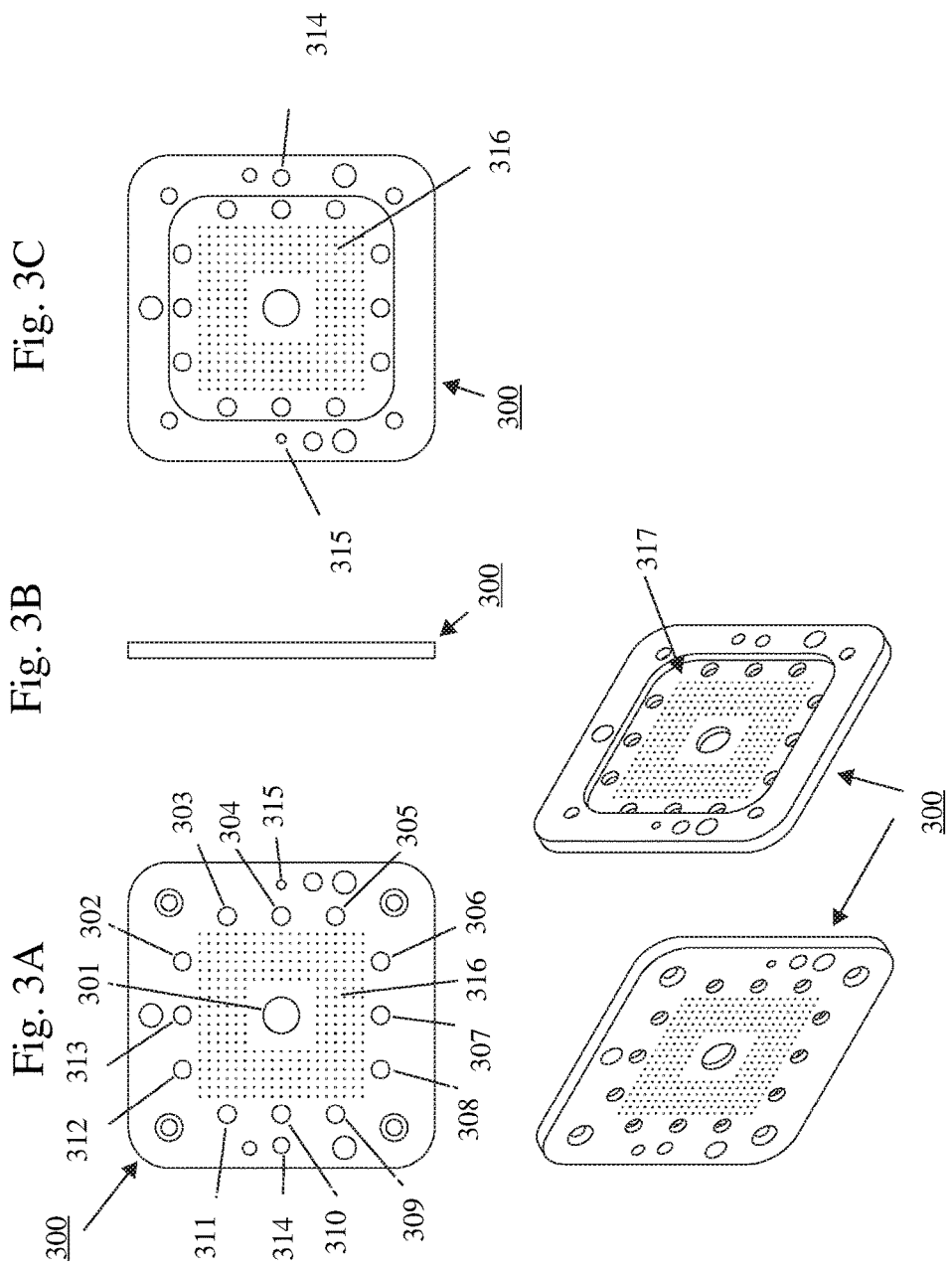

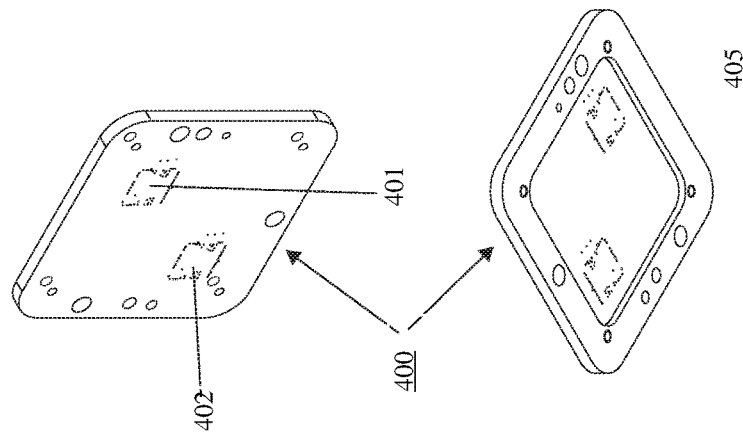
Fig. 4D
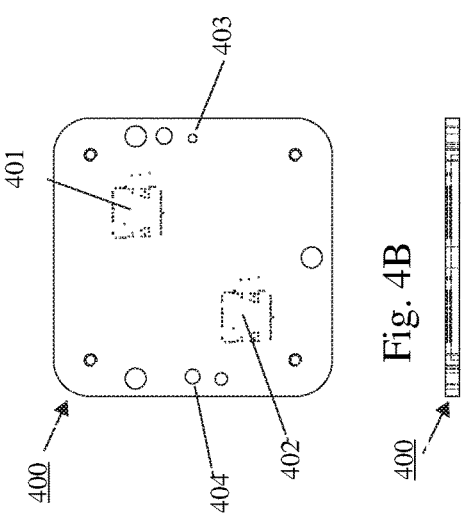
Fig. 4A
Fig. 4B
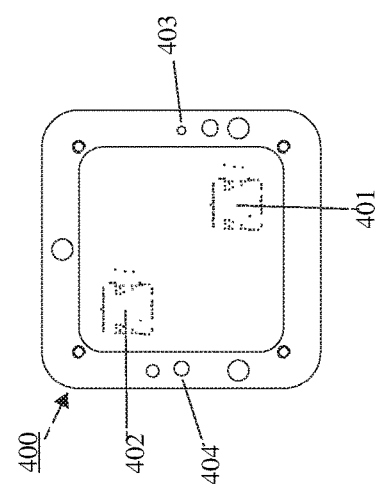
Fig. 4C

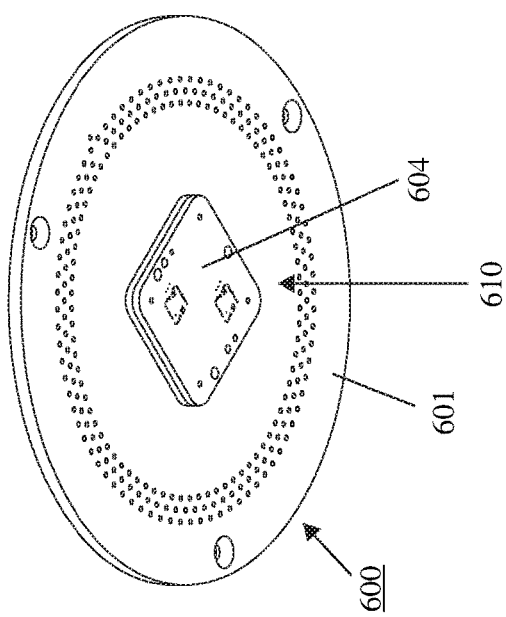
Fig. 6C
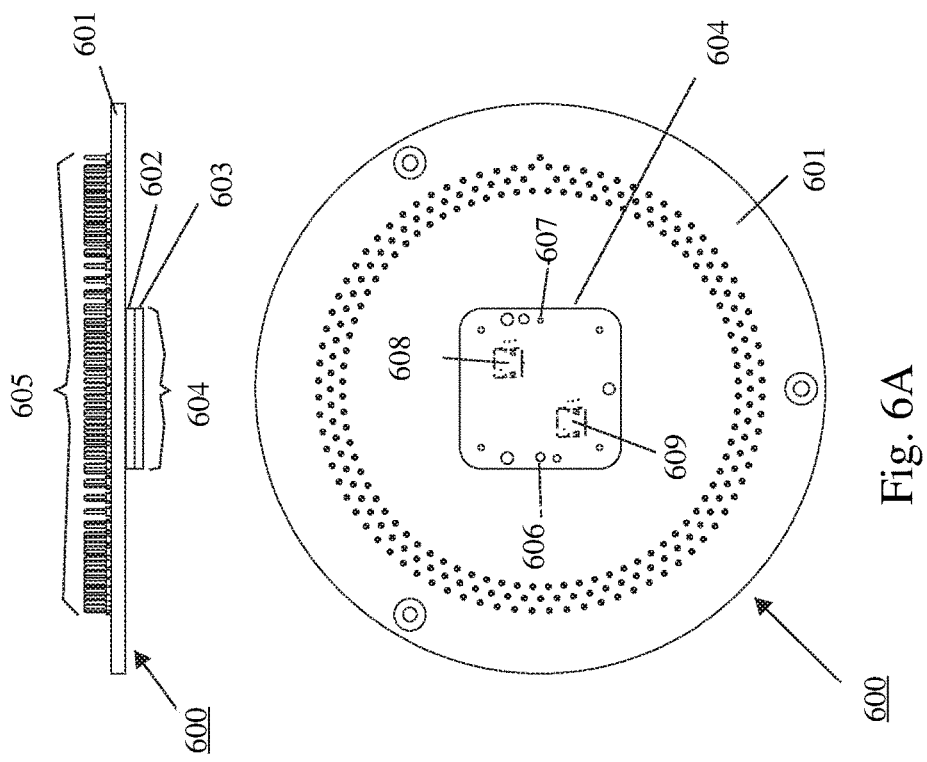
Fig. 6B
Fig. 6A

INTERFACE APPARATUS FOR SEMICONDUCTOR TESTING AND METHOD OF MANUFACTURING SAME

CROSS REFERENCE TO RELATED APPLICATIONS

Not applicable.

BACKGROUND

The present invention relates to an electrical/mechanical interface apparatus, and in particular, to interface apparatus for semiconductor testing and method of manufacturing same.

The pads on semiconductor devices are getting smaller. Traditional cantilever probes need to scrub the pad and with smaller areas, the scrub may extend into the die area potentially causing damage to the device.

An alternative solution is the vertical probe. However interfacing these vertical probe contactors to tester equipment has become more difficult as the pitch between device pads becomes less than 100 microns.

Thus, there is a need for interface apparatus for semiconductor testing and method of manufacturing same.

SUMMARY

Embodiments of the present invention include an interface apparatus for semiconductor testing. The interface apparatus includes a first housing substrate, a second housing substrate, and a plurality of wires. The first housing substrate has a first plurality of apertures arranged according to a first pitch. The second housing substrate mates to the first housing substrate and has a second plurality of apertures arranged according to a second pitch. The plurality of wires passes through the first and second plurality of apertures. Each wire has plated conductive ends emanating from opposing sides of the housing. The first plurality of apertures corresponds to the second plurality of apertures, and the first pitch is less than the second pitch.

In one embodiment the interface apparatus further includes a recessed portion in at least one of the first and second housing substrates thereby providing an internal volume within the housing.

In another embodiment, the plated conductive ends are all plated with the same material and with the same tolerance of thickness.

Embodiments of the present invention include a method of manufacturing an interface apparatus. The method includes drilling, passing, attaching, and cutting. The drilling includes drilling a first plurality of apertures through a first housing substrate. The first plurality of apertures is arranged according to a first pitch. The drilling includes drilling a second plurality of apertures through a second housing substrate. The second plurality of apertures is arranged according to a second pitch. The passing includes passing a plurality of wires through the first and second plurality of apertures. The attaching includes attaching the first housing substrate to the second housing substrate thereby forming a complete housing. The cutting includes cutting wire ends protruding out from the first and the second housing substrates. The first plurality of apertures corresponds to the second plurality of apertures, and the first pitch is less than the second pitch.

In one embodiment the attaching further includes injecting epoxy into an internal volume of the housing. The internal volume formed from a recessed portion in at least one of the first and second housing substrates.

In another embodiment, the method further includes plating. The plating may occur without masking and without a fixture.

Embodiments of the present invention include a system of interfacing a vertical probe assembly with an automated tester. The system includes an interface apparatus. The interface apparatus includes a first housing substrate, a second housing substrate, and a plurality of wires. The first housing substrate has a first plurality of apertures arranged according to a first pitch. The second housing substrate mates to the first housing substrate and has a second plurality of apertures arranged according to a second pitch. The plurality of wires passes through the first and second plurality of apertures. Each wire has plated conductive ends emanating from opposing sides of the housing. The first plurality of apertures corresponds to the second plurality of apertures, and the first pitch is less than the second pitch. The system also includes a PCB which has a plurality of conductive pads. The plurality of conductive pads couple with the plurality of wires positioned within the second plurality of apertures.

In one embodiment the system further comprises a recessed portion in at least one of the first and second housing substrates thereby providing an internal volume within the housing.

The following detailed description and accompanying drawings provide a better understanding of the nature and advantages of the present invention.

BRIEF DESCRIPTION OF THE DRAWINGS

FIGS. 3A-D illustrate an upper housing substrate according to yet another embodiment of the invention. FIG. 3A illustrates a contact side of the upper housing substrate. FIG. 3B illustrates a side view of the upper housing substrate. FIG. 3C illustrates an internal view of the upper housing substrate, and FIG. 3D illustrates two 3-dimensional views of the upper housing substrate.

FIGS. 4A-D illustrate a lower housing substrate according to another embodiment of the invention. FIG. 4A illustrates a contact side of the lower housing substrate. FIG. 4B illustrates a side view of the upper housing substrate. FIG. 4C illustrates an internal view of the lower housing substrate, and FIG. 3D illustrates two 3-dimensional views of the lower housing substrate.

FIG. 5A illustrates a contact side of the PCB. FIG. 5B illustrates a side view of the PCB. FIG. 5C illustrates a detail of an area of FIG. 5A and FIG. 5D illustrates two 3-dimensional views of the PCB.

FIGS. 6A-C illustrate a system of interfacing a tester with a vertical probe contactor according to another embodiment of the invention. FIG. 6A illustrates a contactor side of the system. FIG. 6B illustrates a side view of the system. FIG. 6C illustrates a 3-dimensional view of the system.

DETAILED DESCRIPTION

Described herein are techniques for interface apparatus and method for manufacturing same. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
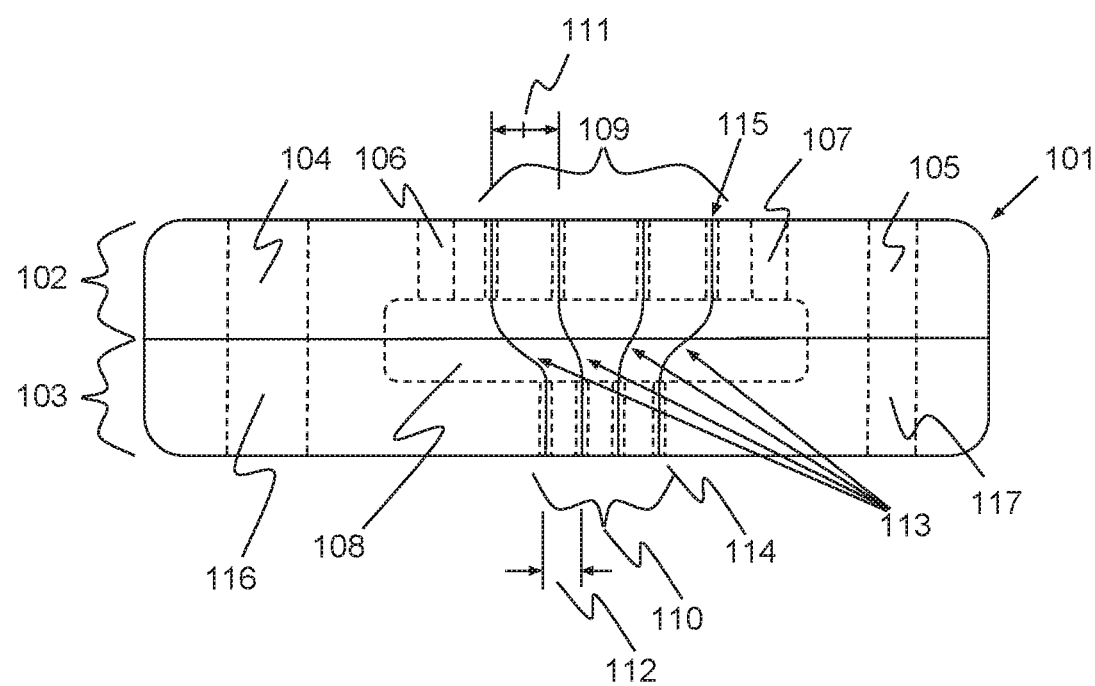
FIG. 1 illustrates an apparatus according to one embodiment of the present invention.

FIG. 1 illustrates an apparatus 100 according to one embodiment of the present invention. Apparatus 100 includes a housing 101 comprising an upper housing substrate 102, a lower housing substrate 103, and a plurality of wires 113 passing through plurality of apertures 109-110. Each wire has plated conductive ends emanating from opposing sides housing 101 (e.g. 114-115). Plurality of apertures 114 corresponds to plurality of apertures 115. For every aperture of the plurality of apertures 114, there is a corresponding aperture of plurality of apertures 115 which the same wire of the plurality of wires 113 are threaded through.

Plurality of apertures 109 has a pitch 111 and plurality of apertures 110 has a pitch of 112. Pitch 112 is less than pitch 111. In some embodiments pitch 112 may be less than or equal to 250 microns. In some embodiments pitch 111 may be greater than or equal to 300 microns. Apparatus 100 interfaces between a course pitch provided by plurality of apertures 109 and a fine pitch provided by plurality of apertures 110. This may allow a technology of greater than 250 micrometers capability to interface with another technology which has less than 100 micrometers capability. For example, a printed circuit board (PCB) (not shown) may have a pattern which may be interfaced to a vertical probe contactor.

Apparatus 100 also has an internal volume 108 which is recessed on both housing substrate 102-103. In another embodiment, only one of the housing substrates (i.e. housing substrate 102 or 103) may include a recessed portion to provide the internal volume. Holes 106-107 may be used to inject epoxy into the internal volume 108. In another embodiment, there may be a plurality of epoxy holes to aid in injecting an even flow of epoxy into internal volume 108. This plurality of epoxy holes may be arrayed along a periphery of the plurality of apertures 102 or 103 in order to provide a complete adhesion of the plurality of wires 113 within plurality of apertures 102-103.

Apparatus 100 also has alignment holes 104-105 and 116-117 that may be used to align housing substrate 102 to housing substrate 103 prior to attaching them with an epoxy injection as described above. Alignment holes 104-105 and 116-117 may also be used to align apparatus 100 to a PCB. For example, plurality of apertures 109 may be arranged in a ball grid array (BGA) pattern so that solder balls or a thick solder paste may be distributed on a conductive BGA pattern on a PCB, and the alignment holes 104-105 and 116-117 may be used to align apparatus 100 to a PCB so that heat may be applied and apparatus 100 may be soldered to the PCB. In one embodiment, the alignment holes 104-105, 116-117 may be used to align a contactor to the apparatus 100 and a PCB (i.e. mechanically interface a contactor to a PCB) and the plurality of apertures 109-110 may electrically interface between the contactor and the PCB.

The plated conductive ends (e.g. 114-115) may be all plated with the same material and with the same tolerance of thickness. This may be accomplished if all the wire ends are plated at the same time. For example, a lot of similar apparatus such as apparatus 100 may be plated together: first by bathing the lot in nickel; and then by bathing the lot in gold. In one embodiment, housing 101 is ceramic such that only the wire ends will adhere to the nickel and gold (respectively).

Figure 2:
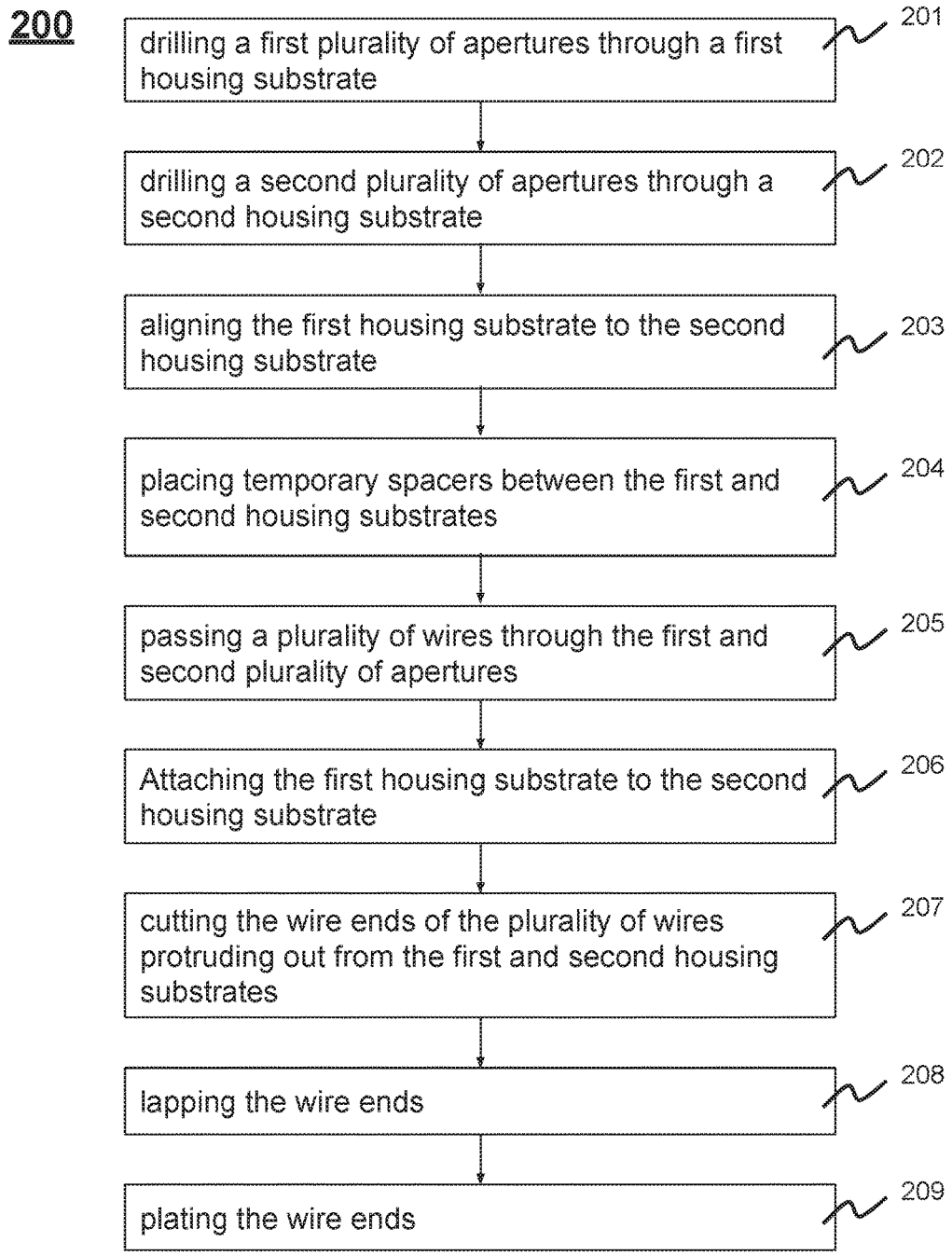
FIG. 2 illustrates a method of manufacturing an interface apparatus according to another embodiment of the present invention.

FIG. 2 illustrates a method of manufacturing 200 an interface apparatus according to another embodiment of the present invention.

At 201, drill a first plurality of apertures through a first housing substrate. The first plurality of apertures is arranged according to a first pitch.

At 202, drill a second plurality of apertures through a second housing substrate. The second plurality of apertures is arranged according to a second pitch.

At 203, align the first and second housing substrate to each other. This may be accomplished by having a fixture which has steal dowels which go through the alignment holes on the first and second housing.

At 204, place temporary spacers between the first and second housing substrates. This may be used to allow enough space to thread the plurality of wires into the respective pluralities of apertures found in the first and second housing substrates.

At, 205, pass a plurality of wires through the pluralities of apertures according to a correspondence between the first and second plurality of apertures.

At 206, attach the first and second housing substrates. This forms a single housing. The attaching may include injecting epoxy into an internal volume of the housing. The internal volume may be formed from a recessed portion in at least one of said first and second housing substrates.

At 207, cut the wire ends of the plurality of wires protruding out from the first and second housing substrates.

At 207, lap the wire ends.

At 208, plate the wire ends. The plating may include gold plating over an initial nickel plating. The plating may occur without masking and without a fixture. For example, in one embodiment, the housing may be made of ceramic such that the entire unit may be placed into a plating bath. This would insure that all the wire ends were plated with the same tolerance of thickness and the same material. This operation does not need masking because the plating material would not adhere to the ceramic portions of the unit.

FIGS. 3A-D illustrate an upper housing substrate 300 according to yet another embodiment of the invention. FIG. 3A illustrates a contact side of upper housing substrate 300 showing alignment holes 314-315, epoxy injection holes 301-313, and plurality of apertures 316. The plurality of apertures 316 is in a BGA pattern in this embodiment.

FIG. 3B illustrates a side view of upper housing substrate 300.

FIG. 3C illustrates an internal view of upper housing substrate 300 showing alignment holes 314-315 and plurality of apertures 316.

FIG. 3D illustrates two 3-dimensional views of upper housing substrate 300. Upper housing substrate 300 includes a recessed portion 317 in which a plurality of wires and an epoxy may reside.

FIGS. 4A-D illustrate a lower housing substrate 400 according to another embodiment of the invention. FIG. 4A illustrates a contact side of lower housing substrate 400 showing plurality of apertures 401-402 and alignment holes 403-404.

FIG. 4B illustrates a side view of upper housing substrate 400.

FIG. 4C illustrates an internal view of lower housing substrate 400 showing plurality of apertures 401-402 and alignment holes 403-404.

FIG. 4D illustrates two 3-dimensional views of lower housing substrate 400. Lower housing substrate 400 includes plurality of apertures 401-402 and a recessed portion 405 in which a plurality of wires and an epoxy may reside.

Figure 5D:
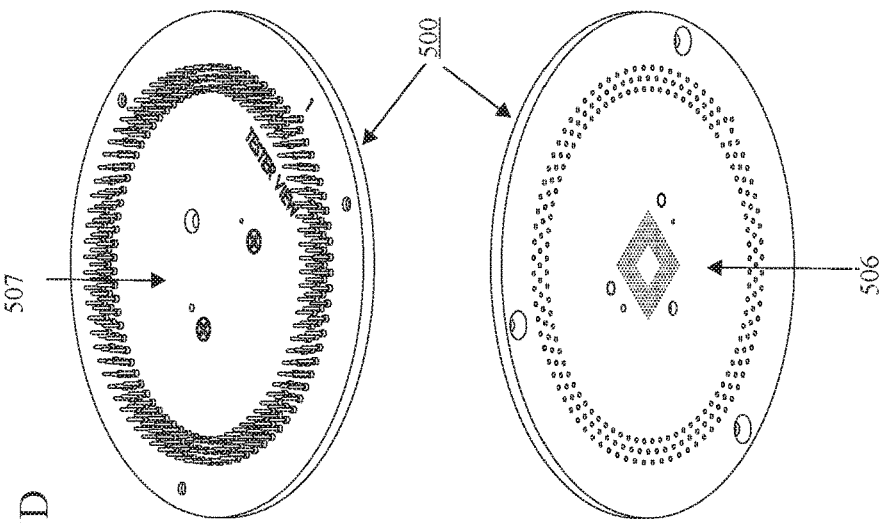
FIGS. 5A-D illustrate a printed circuit board (PCB) configured to attach an interface apparatus according to yet another embodiment of the invention.
Figure 5C:
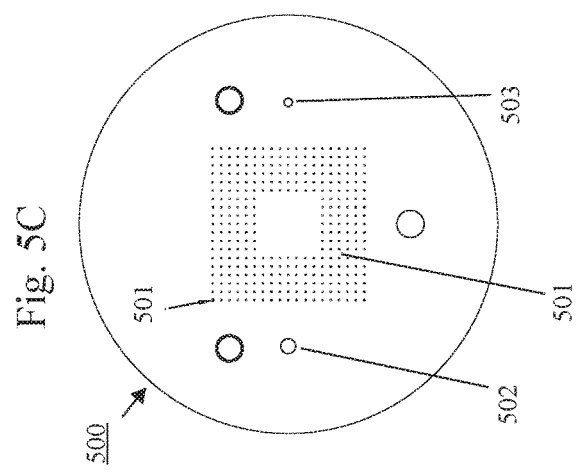
Figure 5B:
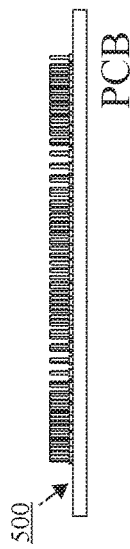
Figure 5A:
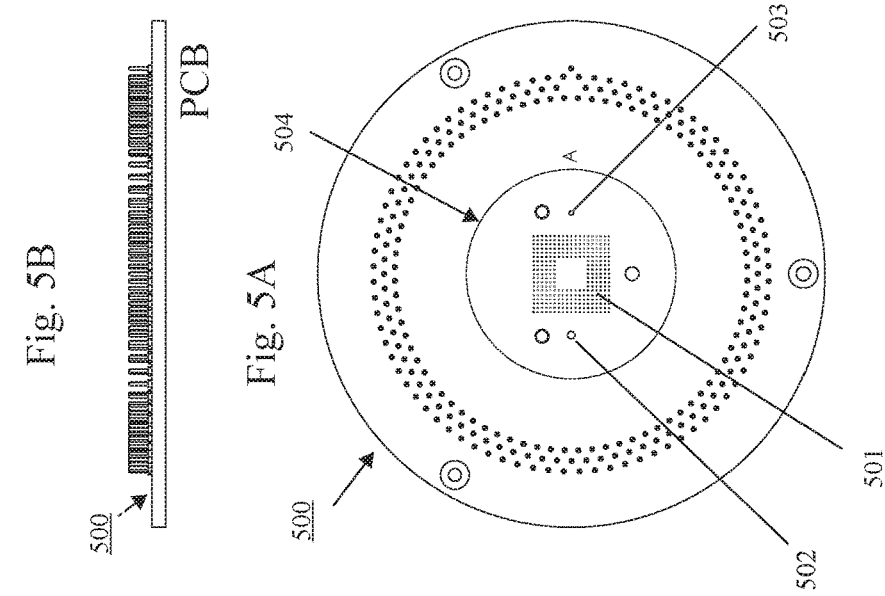

FIGS. 5A-D illustrate a printed circuit board 500 (PCB) configured to attach an interface apparatus according to yet another embodiment of the invention. FIG. 5A illustrates a contact side of PCB 500 showing alignment holes 502-503 and a plurality of conductive pads 501. Area 504 shows the contact area where an interface apparatus may be attached.

FIG. 5B illustrates a side view of PCB 500. PCB 500 includes a plurality of pins to interface to a test plate. PCB 500 may be a daughter board configured as a contactor interface board. In one embodiment, PCB 500 may be a general interface board which may be used on a family of test plates in order to quickly replace the vertical probes on a test system.

FIG. 5C illustrates a detail of area 504 of FIG. 5A showing alignment holes 502-503 and conductive pads 501. In one embodiment, conductive pads 501 may have a solder mask. In another embodiment, the plurality of conductive pads 501 may be arranged in a BGA pattern and bumped with solder balls (e.g. solder ball 505). The plurality of conductive pads 501 may have positions to couple with a plurality of wires positioned within a plurality of apertures also arranged in the same BGA pattern.

FIG. 5D illustrates two 3-dimensional views of PCB 500. Contactor side 506 may be where an interface apparatus may be attached. PCB 500 may be attached to a tester though a test plate from the tester side 507 side.

FIGS. 6A-C illustrate a system 600 of interfacing a tester with a vertical probe contactor according to another embodiment of the invention. FIG. 6A illustrates a contactor side of system 600 showing interface apparatus 604 attached to PCB 601. Interface apparatus 604 includes a plurality of conductive ends 608-609 and alignment holes 606-607. System 600 is a dual site interface system designed to contact 2 die simultaneously. Other configurations of multisite arrangements are also possible in other embodiments. Alignment holes 606-607 may be used to align a contactor to interface apparatus 604.

FIG. 6B illustrates a side view of system 600. FIG. 6B shows PCB 601 having a plurality of pins 605 on the tester side of system 600 and an interface apparatus 604 attached on the contactor side of system 600. Interface apparatus 604 includes an upper housing substrate 602 and a lower housing substrate 603.

FIG. 6C illustrates a 3-dimensional view of system 600. FIG. 6C shows the contactor side 610 of system 600. Interface apparatus 604 is shown attached to PCB 601. In other embodiments, interface apparatus 604 may be attached directly to a test plate which interfaces to a tester. In another embodiment, interface apparatus 604 may be attached to a swap block which couples to test instruments through a pogo tower and general interface PCB.

The above description illustrates various embodiments of the present invention along with examples of how aspects of the present invention may be implemented. The above examples and embodiments should not be deemed to be the only embodiments, and are presented to illustrate the flexibility and advantages of the present invention. Based on the above disclosure, other arrangements, embodiments, implementations and equivalents will be evident to those skilled in the art and may be employed without departing from the spirit and scope of the invention.

What is claimed is:

1. A method of manufacturing an interface apparatus, said method comprising:
   drilling a first plurality of apertures through a first housing substrate, said first plurality of apertures arranged according to a first pitch;
   forming a recessed portion in a second housing substrate;
   drilling a second plurality of apertures through said second housing substrate, said second plurality of apertures arranged according to a second pitch;
   drilling a plurality of injection holes (being disposed) between boundaries of said recessed portion and a periphery of said second plurality of apertures;
   passing a plurality of wires through said first and second plurality of apertures;
   attaching said first housing substrate to said second housing substrate thereby forming a housing; and
   cutting a wire ends protruding out from said first and said second housing substrates,
   wherein said first plurality of apertures corresponds to said second plurality of apertures, and wherein said first pitch is less than said second pitch.

2. The method of claim 1 wherein said attaching further includes injecting epoxy into said recessed portion through said plurality of injection holes.

3. The method of claim 1 further comprising placing temporary spacers between said first and second housing substrates.

4. The method of claim 3 further comprising aligning said first and said second housing substrate.

5. The method of claim 1 further comprising:
   lapping said wire ends; and
   plating said wire ends.

6. The method of claim 5 wherein said plating occurs without masking and without a fixture.

7. The method of claim 5 further comprising:
   bumping a plurality of conductive pads of a printed circuit board (PCB), said plurality of conductive pads having a position to couple with said plurality of wires positioned within said second plurality of apertures; and
   soldering said housing to said PCB by heating a solder of said bumping.

* * * * *